US012085239B2

(12) United States Patent
Hikmet et al.

(10) Patent No.: US 12,085,239 B2
(45) Date of Patent: Sep. 10, 2024

(54) HIGH-INTENSITY LIGHT SOURCE WITH HIGH CRI

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 17/760,833

(22) PCT Filed: Sep. 14, 2020

(86) PCT No.: PCT/EP2020/075608
§ 371 (c)(1),
(2) Date: Mar. 16, 2022

(87) PCT Pub. No.: WO2021/052900
PCT Pub. Date: Mar. 25, 2021

(65) Prior Publication Data
US 2022/0341550 A1    Oct. 27, 2022

(30) Foreign Application Priority Data

Sep. 18, 2019   (EP) ..................... 19197971

(51) Int. Cl.
*F21K 9/64*       (2016.01)
*H01L 33/50*      (2010.01)
(Continued)

(52) U.S. Cl.
CPC .............. *F21K 9/64* (2016.08); *H01L 33/502* (2013.01); *H01S 5/0087* (2021.01); *F21Y 2113/10* (2016.08)

(58) Field of Classification Search
CPC ....................................................... F21K 9/64
See application file for complete search history.

(56) References Cited

U.S. PATENT DOCUMENTS 7,821,194 B2 * 10/2010 Negley ..................... F21K 9/00
                                                                 362/249.02
7,828,460 B2 * 11/2010 Van De Ven ........... F21V 7/041
                                                                         257/89
(Continued)

FOREIGN PATENT DOCUMENTS

CN      111033366 A     4/2020
DE    102008012316 A1   4/2009
(Continued)

*Primary Examiner* — Andrew J Coughlin

(57) ABSTRACT

The invention provides a light generating device (1000) configured to generate device light (1001), wherein the light generating device (1000) comprises (i) a first light source (110) configured to generate blue first light source light (111), wherein the first light source (110) is a first laser light source (10), (ii) a first luminescent material (210) configured to convert part of the blue first light source light (111) into first luminescent material light (211) having an emission band having wavelengths in one or more of the green and yellow, (iii) an optical filter (410) configured to optically filter the first luminescent material light (211) into optically filtered first luminescent material light (213), whereby the optically filtered first luminescent material light (213) is red-shifted relative to the first luminescent material light (211), and (iv) a second light source (120) configured to generate red second light source light (121), wherein the second light source (120) comprises a second laser light source (20); wherein in one or more operational modes of the light generating device (1000) the light generating device (1000) is configured to generate white device light (1001) comprising the first light source light (111), the optically filtered first luminescent material light (213), and the second light source light (121).

16 Claims, 3 Drawing Sheets

(51) Int. Cl.
  *H01S 5/00* (2006.01)
  *F21Y 113/10* (2016.01)

(56) References Cited

U.S. PATENT DOCUMENTS

| | | | |
|---|---|---|---|
| 9,349,924 B2* | 5/2016 | Hoelen | H01L 33/644 |
| 2010/0295438 A1 | 11/2010 | Ott et al. | |
| 2013/0077055 A1 | 3/2013 | Wang et al. | |
| 2014/0126200 A1 | 5/2014 | Kelchner et al. | |
| 2015/0054007 A1* | 2/2015 | Edaka | A47F 11/10 |
| | | | 257/89 |
| 2015/0167907 A1 | 6/2015 | Hoehmann | |
| 2017/0331012 A1* | 11/2017 | Heidemann | C09K 11/02 |
| 2018/0026165 A1* | 1/2018 | Bechtel | G02B 6/0003 |
| | | | 257/98 |
| 2018/0112850 A1* | 4/2018 | Van Bommel | F21K 9/64 |
| 2018/0248084 A1* | 8/2018 | Peeters | F21V 9/40 |
| 2018/0316160 A1 | 11/2018 | Raring et al. | |
| 2018/0363858 A1* | 12/2018 | Peeters | G02B 6/0003 |

FOREIGN PATENT DOCUMENTS

| | | |
|---|---|---|
| EP | 3271013 A1 | 1/2018 |
| EP | 3312892 A1 | 4/2018 |
| WO | 2006054203 A1 | 5/2006 |
| WO | 2018141625 A1 | 8/2018 |

* cited by examiner

HIGH-INTENSITY LIGHT SOURCE WITH HIGH CRI

CROSS-REFERENCE TO PRIOR APPLICATIONS

This application is the U.S. National Phase application under 35 U.S.C. § 371 of International Application No. PCT/EP2020/075608, filed on Sep. 14, 2020, which claims the benefit of European Patent Application No. 19197971.5, filed on Sep. 18, 2019. These applications are hereby incorporated by reference herein.

FIELD OF THE INVENTION

The invention relates to a light generating device and to a luminaire comprising such light generating device.

BACKGROUND OF THE INVENTION

White light sources using a laser diode and phosphor are known in the art. US2018/0316160, for instance, describes a device and method for an integrated white colored electromagnetic radiation source using a combination of laser diode excitation sources based on gallium and nitrogen containing materials and light emitting source based on phosphor materials. A violet, blue, or other wavelength laser diode source based on gallium and nitrogen materials may be closely integrated with phosphor materials, such as yellow phosphors, to form a compact, high-brightness, and highly efficient, white light source. The phosphor material is provided with a plurality of scattering centers scribed on an excitation surface or inside bulk of a plate to scatter electromagnetic radiation of a laser beam from the excitation source incident on the excitation surface to enhance generation and quality of an emitted light from the phosphor material for outputting a white light emission either in reflection mode or transmission mode.

SUMMARY OF THE INVENTION

While white LED sources can give intensity 300 lm/mm$^2$ whereas static phosphor converted laser white sources can give 20.000 lm/mm$^2$. Ce doped garnets (YAG, LuAG) may be the most suitable luminescent convertors which can be used for pumping with a blue laser light as garnet matrix has the highest chemical stability and at low Ce concentrations (below 0.5%) temperature quenching occurs above 200° C. Furthermore, emission from Ce has a very fast decay time so that optical saturation can be avoided. In previous applications such as automotive the correlated color temperatures above 5000 K at low CRI have been demonstrated. When for example light sources with an intensity higher than 1 GCd/m$^2$ with CRI>90 and at lower CCT<3000K need to be produced, there is a need for laser light with an emission wavelength around 620 nm need to be used in addition to the light emitted by YAG phosphors. However, such diode lasers emitting at such wavelengths are relatively inefficient. Therefore, a laser emitting around or above 630 nm may be desirable.

Hence, it is an aspect of the invention to provide an alternative light generating device, which preferably further at least partly obviates one or more of above-described drawbacks. The present invention may have as object to overcome or ameliorate at least one of the disadvantages of the prior art, or to provide a useful alternative.

In a first aspect, the invention provides a light generating device ("lighting device" or "device") configured to generate device light ("light generating device light"). The light generating device comprises (i) a first light source, (ii) a first luminescent material, (iii) optionally an optical filter, and (iv) a second light source. Especially, in embodiments the first light source is configured to generate blue first light source light. In specific embodiments, the first light source comprises a first laser light source (configured to generate first laser light source light). Hence, in specific embodiments the first light source light is first laser light source light. Especially, in embodiments the first luminescent material is configured to convert part of the blue first light source light into first luminescent material light having an emission band having wavelengths in one or more of the green and yellow. Further, especially in embodiments the optical filter is configured to optically filter the first luminescent material light into optically filtered first luminescent material light, whereby in specific embodiments the optically filtered first luminescent material light color point is red-shifted relative to the first luminescent material light (as generated by the first luminescent material). Yet further especially, in embodiments the second light source is configured to generate red second light source light. In specific embodiments, the second light source comprises a second laser light source (configured to generate second laser light source light). Hence, in specific embodiments the second light source light is second laser light source light. In specific embodiments, in one or more operational modes of the light generating device, the light generating device is configured to generate white device light comprising the first light source light, the optically filtered first luminescent material light, and the second light source light. Hence, in specific embodiments the invention provides a light generating device configured to generate device light, wherein the light generating device comprises (i) a first light source configured to generate blue first light source light, wherein the first light source comprises a first laser light source, (ii) a first luminescent material configured to convert part of the blue first light source light into first luminescent material light having an emission band having wavelengths in one or more of the green and yellow, (iii) an optical filter configured to optically filter the first luminescent material light into optically filtered first luminescent material light, whereby the optically filtered first luminescent material light is red-shifted relative to the first luminescent material light, and (iv) a second light source configured to generate red second light source light, wherein the second light source comprises a second laser light source; wherein in one or more operational modes of the light generating device the light generating device is configured to generate white device light comprising the first light source light, the optically filtered first luminescent material light, and the second light source light.

With such device it is possible to provide with a high intensity white light with a relatively low correlated color temperature and with a relatively high color rendering index, such as at least 85, like even about 90. Further, the white light may be provided in a relatively efficient way with, in specific embodiments, a power loss of preferably less than 10% and more especially a power loss of 5% with respect to total power of the white light source. In this way a relatively efficient and/or with thermally stable components can be obtained.

As indicated above, the light generating device comprises (i) a first light source configured to generate blue first light source light. Hence, the first light source light has a color point in the blue. Especially, the first light source comprises a first laser light source. The first laser light source is especially configured to generate first laser light source light. The first light source light may in embodiments essentially consist of the first laser light source light. Hence, in embodiments the first light source is a first laser light source. In embodiments, the term "first light source" may also refer to a plurality of the same first light sources. In embodiments, a bank of first laser light sources may be applied. Alternatively or additionally, the term "first light source" may also refer to a plurality of different first light sources. In embodiments, the term "first laser light source" may also refer to a plurality of the same first laser light sources. Alternatively or additionally, the term "first laser light source" may also refer to a plurality of different first laser light sources.

Further, as indicated above the light generating device comprises (iv) a second light source configured to generate red second light source light. Hence, the second light source light has a color point in the red. Especially, the second light source comprises a second laser light source. The second laser light source is especially configured to generate second laser light source light. The second light source light may in embodiments essentially consist of the second laser light source light. Hence, in embodiments the second light source is a second laser light source. Hence, in embodiments the second light source is a second laser light source. In embodiments, the term "second light source" may also refer to a plurality of the same second light sources. In embodiments, a bank of second laser light sources may be applied. Alternatively or additionally, the term "second light source" may also refer to a plurality of different second light sources. In embodiments, the term "second laser light source" may also refer to a plurality of the same second laser light sources. Alternatively or additionally, the term "second laser light source" may also refer to a plurality of different second laser light sources.

Hence, in embodiments at least a first laser light source and at least a second laser light source may be comprised by the light generating device. Herein, the terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component.

Here below, some aspects in relation to the first light source and the second light source are discussed. The first light source and the second light source may be individually chosen and are thus not necessarily of the same type (notwithstanding the fact that the first light source and second light source are by definition different as the light source light generated by the first light source differs in spectral power distribution from the second light source light).

The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd:YVO$_4$) laser, neodymium glass (Nd:glass) laser, neodymium YLF (Nd:YLF) solid-state laser, promethium 147 doped phosphate glass (147Pm$^{3+}$:glass) solid-state laser, ruby laser (Al$_2$O$_3$:Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank. The laser bank may in embodiments comprise heat sinking and/or optics e.g. a lens to collimate the laser light. For instance, a bank may comprise at least 10 laser light sources.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources.

In specific embodiments, the light source light is thus especially collimated light source light. In yet further embodiments, the light source light is especially (collimated) laser light source light.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

In embodiments, the beam of light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Downstream of a laser, one or more optical elements may be configured to provide the collimated beam. For instance, in embodiments one or more lenses, especially at least two lenses, may be configured.

As indicated above, in embodiments the first light source light may essentially consist of the laser light source light. In further specific embodiments, the first light source light may essentially consist of first laser light source light of one or more essentially identical laser light sources (such as from the same bin). Further, as indicated above, in embodiments the second light source light may essentially consist of the laser light source light. In further specific embodiments, the second light source light may essentially consist of second laser light source light of one or more essentially identical laser light sources (such as from the same bin).

In specific embodiments, the first light source light may have a peak maximum $\lambda_1$, wherein $\lambda_1$ is selected from the range of 470 nm±10 nm, especially 470 nm±5 nm, such as in specific embodiments 470 nm±2 nm. The wavelength around 470 nm appears surprisingly to provide, especially in combination with the first luminescent material light, the optical filter, and the second light source light, relatively high CRI and/or desirable color temperatures in a relatively efficient way.

In yet further specific embodiments, the second light source light has a peak maximum $\lambda_2$, wherein $\lambda_2$ is selected from the range of 630 nm±10 nm, especially 630 nm±5 nm, such as in specific embodiments 630 nm±2 nm. As can be derived from the above, the wavelength around 630 nm appears surprisingly to provide, especially in combination with the first light source light, the first luminescent material light, and the optical filter, relatively high CRI and/or desirable color temperatures in a relatively efficient way.

As further indicated above, the light generating device comprises (ii) a first luminescent material.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex}<\lambda_{em}$), though in specific embodiments the luminescent material may comprise down-converter luminescent material, i.e. radiation of a larger wavelength is converted into radiation with a smaller wavelength ($\lambda_{ex}>\lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials.

Especially, the first luminescent material is configured to convert part of the blue first light source light into first luminescent material light having an emission band having wavelengths in one or more of the green and yellow. Further, especially the first luminescent material light has one or more wavelengths in the range of about 500-700 nm. Further, in specific embodiments the first luminescent material light has a full width half maximum (FWHM) of at least 50 nm, such as at least 75 nm, like in specific embodiments up to about 130 nm (at room temperature). Especially, the first luminescent material light has a color point in the green or yellow, especially in the yellow. Especially, in embodiments the first luminescent material light has a dominant wavelength selected from the range of 540-580 nm, more especially selected from the range of 555-575 nm. Especially, at least 85% of the spectral power (in Watt) of the first luminescent material light, such as at least 90%, is within the range of 500-700 nm.

Especially suitable luminescent materials are cerium comprising garnet materials. Embodiments of garnets especially include $A_3B_5O_{12}$ garnets, wherein A in embodiments comprises one or more of Y, La, Gd, Tb and Lu, especially (at least) one or more of Y, Gd, Tb and Lu, even more especially wherein A comprises at least yttrium or lutetium and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely A. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$.

Ce in garnets is substantially or only in the trivalent state, as is known to the person skilled in the art.

In embodiments, the first luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A_{x2}Ce_{x3})_3(Al_{y1-y2}B_{y2})_5O_{12}$, wherein $x1+x2+x3=1$, wherein $x3>0$, wherein $0<x2+x3\leq 0.2$, wherein $y1+y2=1$, wherein $0\leq y2\leq 0.2$, wherein A comprises one or more elements selected from the group consisting of lanthanides, and wherein B comprises one or more elements selected from the group consisting of Ga, In and Sc., In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially such luminescent materials may have a suitable spectral distribution (see however below), have a relatively high efficiency, have a relatively high thermal stability, and allow a high CRI (in combination with the first light source light and the second light source light (and the optical filter)).

Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3\leq 0.1$, and wherein $0\leq y2\leq 0.1$.

Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein $x1+x3=1$, and wherein $0<x3\leq 0.2$, such as 0.001-0.1.

Hence, in specific embodiments, the light generating device may only include luminescent materials selected from the type of cerium comprising garnets. In even further specific embodiments, the light generating device includes a single type of luminescent materials, such as $(Y_{x1-x2-x3}A_{x2}Ce_{x3})_3(Al_{y1-y2}B_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3\leq 0.2$, wherein $y1+y2=1$, wherein $0\leq y2\leq 0.2$. Especially, x3 is selected from the range of 0.001-0.1. Note that in embodiments $x2=0$. Alternatively or additionally, in embodiments $y2=0$.

In specific embodiments, A may especially comprise at least Y, and B may especially comprise at least Al.

Suitable luminescent materials may have a relatively broad emission band (see also above). In view of CRI and/or R9 and/or the efficiency, such emission band may extend too much in the green/blueish. Hence, it may be desirable to reduce intensity in this wavelength range. Especially to this end, the light generating device may further comprise (iii) an optical filter configured to optically filter the first luminescent material light into optically filtered first luminescent material light. Especially, the optical filter may be configured to red-shift luminescent material light that has (substantial) intensity in wavelength ranges below about 525 nm. Hence, especially in embodiments the optically filtered first luminescent material light may be red-shifted relative to the first luminescent material light. Hence, in embodiments an optical filter may be applied. The term "optical filter" may also refer to a plurality of different optical filters. In embodiments, the optical filter may comprise a rejection filter (or inverse bandpass filter), like e.g. a notch rejection filter. Such a notch filter can simply absorb a part of the luminescent light. In yet other embodiments, the optical filter may also comprise a long pass filter, i.e. a filter that has a lower transmission at smaller wavelengths than at larger wavelengths. Such a light reflecting filter (dichroic filter made of multi layers) may also reflect a part of luminescent light so that it can be reabsorbed by the luminescent material giving enhanced red shift. In very specific embodiments, the optical filter may comprise a second luminescent material, different from the first luminescent material, e.g. configured to convert one or more of the first light source light and/or the first luminescent material light in second luminescent material light. The second luminescent material light may e.g. have a dominant wavelength in the orange-red wavelength range. Examples of such second luminescent material may e.g. be $M_2Si_5N_8:Eu^{2+}$ and/or $MAlSiN_3:Eu^{2+}$ and/or $Ca_2AlSi_3O_2N_5$: $Eu^{2+}$, etc., wherein M comprises one or more of Ba, Sr and Ca, especially in embodiments at least Sr.

Therefore, the phrase "optically filtered first luminescent material light color point is red-shifted relative to the first luminescent material light" may indicate that effectively the spectral power distribution shifts to higher wavelengths. This may also be reflected in a (slightly) larger dominant wavelength of the (spectral power distribution of the) optically filtered first luminescent material light.

Hence, in embodiments the optical filter may have a wavelength dependent light transmission with a first wavelength range of $\lambda_{f11}$-$\lambda_{f12}$ nm having a first wavelength averaged light transmission and a second wavelength range of $\lambda_{f21}$-$\lambda_{f22}$ nm having a second wavelength averaged light transmission, wherein the first wavelength averaged light transmission is smaller than the second wavelength averaged light transmission, and wherein $\lambda_{f11} < \lambda_{f12} \leq \lambda_{f21} < \lambda_{f22}$. Especially, in embodiments $\lambda_{f12}$ and $\lambda_{f21}$ are selected from the range of 515 nm±20 nm, such as 515 nm±15 nm, like 515 nm±10 nm. The optical filter in some configurations also need to transmit blue light at least partly (see further also below). The parameter $\lambda_{f11}$ refers to the lower limit, in nm, of the first wavelength range. The parameter $\lambda_{f12}$ refers to the upper limit, in nm, of the first wavelength range. The parameter $\lambda_{f21}$ refers to the lower limit, in nm, of the second wavelength range. The parameter $\lambda_{f22}$ refers to the upper limit, in nm, of the second wavelength range.

As is clear from the above, the position of the first wavelength range and its first wavelength averaged light transmission and the position of the second wavelength range and its second wavelength averaged light transmission are especially used to reduce a blueish-green part of the first luminescent material light, whereby the optically filtered first luminescent material light is red-shifted so that dominant wavelength of the filtered material shows a redshift selected from the range of about 0.5-20 nm, like 0.5-15 nm, such as 0.5-10 nm, like especially 1-10 nm. In embodiments, the red-shift may be up to about 10 nm, especially up to about 5 nm, even more especially up to about 3 nm relative to the first luminescent material light not (yet) optically filtered, such as 0.5-2 nm. In specific embodiments, a dominant wavelength of the optically filtered first luminescent material light is red-shifted relative to the first luminescent material light with a (wavelength) shift (to the red) selected from the range of 1-10 nm.

As can be derived from the above, in embodiments the optical filter is configured downstream of the first luminescent material. Hence, luminescent material light having a wavelength in the first wavelength range will at least partly be rejected by the optical filter whereas luminescent material light having a wavelength in the second wavelength range will at least partly be accepted. As indicated above, the transmission for wavelengths will in average be smaller in the first wavelength range than in the second wavelength range. Hence, the transmission averaged over the wavelengths in the first wavelength range is smaller than the transmission averaged over the wavelengths in the second wavelength range.

The optical filter may be in physical contact with the first luminescent material. However, the optical filter and first luminescent material may also have a non-zero distance, such as e.g. selected from the range of 0.01-10 mm. Without physical contact, especially at a distance of at least about 0.001 mm, there may be less light loss.

The first wavelength averaged light transmission may be indicated with $T_{f1a}$ and the second wavelength averaged light transmission may be indicated with $T_{f2a}$. In specific embodiments, $T_{f1a}/T_{f2a}<0.9$, especially $T_{f1a}/T_{f2a}<0.75$, even more especially $T_{f1a}/T_{f2a}<0.5$. Hence, in embodiments the first wavelength averaged light transmission may be at least two times smaller than the second wavelength averaged light transmission. In yet even more specific embodiments, $T_{f1a}/T_{f2a}<0.4$, especially $T_{f1a}/T_{f2a}<0.2$, even more especially $T_{f1a}/T_{f2a}<0.1$. Hence, in embodiments there is essentially no transmission in the first wavelength range. In this way, at the shorter wavelengths the first luminescent material light may at least partly be rejected, whereas at longer wavelength the rejection may be smaller or substantially or completely absent. In this way the first luminescent material light is red-shifted.

In embodiments, $T_{f2a}$ may be at least 20%, especially at least 30%, even more especially at least 40%, such as at least 50%. In yet further specific embodiments, $T_{f2a}$ may be at least 60%, especially at least 70%, or even at least 80%, such as at least 90%.

Again, hereabove ranges may especially refer to the emission of luminescent material. In some configurations the filter may be substantially transparent to blue laser light.

The optical filter may be configured in a transmissive configuration or reflective configuration, especially in a transmissive configuration. Whether the optical filter is configured in a transmissive configuration or reflective configuration, herein the terms "transmission" or "wavelength averaged light transmission", and similar terms in relation to (relative) values of transmission or rejection of light, are used to indicate the extend of transmission or rejection.

The fact that two wavelength ranges are mentioned does not exclude more than two (relevant) wavelength ranges for the optical filter. For instance, in the case of a rejection filter, there may be a further wavelength range, at wavelengths shorter than the first wavelength range, where the transmission is in average higher than in the first wavelength range.

In embodiments, especially wherein the optical filter comprises a rejection filter, $\lambda_{f11}$ may be selected from the range of 480-510 nm. In embodiments, especially wherein the optical filter comprises a long pass filter $\lambda_{f11}$ may be selected from the range of at maximum 510 nm, such as selected from the range of 380-510, though lower limits may also be possible.

In embodiments, $\lambda_{f22}$ may be selected from the range of at least 700 nm, such as selected from the range of 750 nm or larger, like at least 780 nm.

In embodiments, $\lambda_{f12}=\lambda_{f21}$. Especially, this may be useful when there is a relatively sharp change in the transmission over a few nanometers. In embodiments wherein $\lambda_{f12} \neq \lambda_{f21}$, especially $\lambda_{f21}-\lambda_{f12} \leq 20$ nm, even more especially $\lambda_{f21}-\lambda_{f12} \leq 10$ nm. Especially, $\lambda_{f12} \neq \lambda_{f21}$ may be chosen as there may be a sharp or more gradual change in the transmission (over a few nanometers). However, also when there is a sharp or more gradual change in the transmission (over a few nanometers) $\lambda_{f12}=\lambda_{f21}$.

In specific embodiments, $\lambda_{f11}>\lambda_1$. This may especially be useful when the optical filter is a rejection filter that should essentially not reject the first light source light.

Hence, in embodiments there may also be a third wavelength range $\lambda_{f31}$-$\lambda_{f32}$, wherein $\lambda_{f31}<\lambda_{f32} \leq \lambda_{f11}$. In embodiments, $\lambda_{f31}$ and $\lambda_{f32}$ may both be selected from the range of 380-480 nm. The third wavelength range may have a third wavelength averaged light transmission. In embodiments, the first wavelength averaged light transmission is smaller than the third wavelength averaged light transmission.

The third wavelength averaged light transmission may be indicated with $T_{f3a}$. In specific embodiments, $T_{f1a}/T_{f3a}<0.9$, especially $T_{f1d}/T_{f3a}<0.75$, even more especially $T_{f1d}/T_{f3a}<0.5$. Hence, in embodiments the first wavelength averaged light transmission may be at least two times smaller than the third wavelength averaged light transmission. In yet even more specific embodiments, $T_{f1d}/T_{f3a}<0.4$, especially $T_{f1d}/T_{f3a}<0.2$, even more especially $T_{f1d}/T_{f3a}<0.1$. In this way, e.g. blue light may be transmitted (assuming the blue light is within the third wavelength range).

Further, in view of the desired high CRI it appears useful to choose $\lambda_{f21}<530$ nm. Choosing $\lambda_{f21}$ too high, there may be a relatively large red-shift, which may have (again) a detrimental effect on the CRI.

As further indicated above, the light generating device is especially configured to generate device light. In one or more operational modes of the light generating device the light generating device is configured to generate white device light comprising the first light source light, the optically filtered first luminescent material light, and the second light source light.

The system, or apparatus, or device may execute an action in a "mode" or "operation mode" or "mode of operation" or "operational mode". Likewise, in a method an action or stage, or step may be executed in a "mode" or "operation mode" or "mode of operation". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability). Hence, in embodiments, the control system may control in dependence of one or more of an input signal of a user interface, a sensor signal (of a sensor), and a timer. The term "timer" may refer to a clock and/or a predetermined time scheme. See further also below.

Especially, there may be a plurality of modes of operation, such as at least two, like at least three, such as at least five, like at least 8, such as at least 16. A change between the modes of operation may be stepwise or stepless. Control can be analogical or digital.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. . . . Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. . . . The device is thus not necessarily coupled to the lighting system but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, ZigBee, BLE or WiMAX, or another wireless technology.

In specific embodiments, all first light source light that is comprised by the device light is either one or more of reflected, scattered, and transmitted by the first luminescent material. In general, in such embodiments the optical filter should be transparent for at least part of the first light source light. Or, in other words, the (extend of) rejection of the first light source light by the optical filter should be much smaller than of the light having wavelengths in the first wavelength range $\lambda_{f11}-\lambda_{f12}$.

However, in other embodiments part of the first light source light may bypass the first luminescent material. This may e.g. be useful in configurations wherein the other part is essentially completely converted by the first luminescent material. Hence, in embodiments the first light source and optional first optics are configured to irradiate the first luminescent material with a part of the first light source light, wherein another part of the first light source light is configured to bypass the first luminescent material; wherein in one or more operational modes of the light generating device the light generating device is configured to generate white device light comprising the first light source light that bypassed the first luminescent material, the optically filtered first luminescent material light, and the second light source light. Optionally, the device light may also comprise part of the unconverted first light source light that did not bypass the first luminescent material but was also not converted thereby (in case such first light source light would be available).

The first optics may e.g. be a beam splitter. In this way, first light source light may be split in a part for generating the first luminescent material light and a part that bypasses the first luminescent material (and is thus not scattered, transmitted, or reflected thereby). Alternatively or additionally, two or more first light sources may be applied, of which (the first light source light of) one (or more of the two or more first light sources) is used to bypass the first luminescent material, and of which (the first light source light of) the other one (or more of the two or more first light sources) is used to excite the luminescent material.

With respect to the second light source, the second light source light may in embodiments (also) be one or more of reflected, transmitted, and scattered by the first luminescent material (see further also below). However, in (other) embodiments the second light source light (also) does not have essentially any interaction with the first luminescent material, as it may be added with the luminescent material light, i.e. downstream of the first luminescent material. Hence, in specific embodiments the second light source is configured downstream of the first luminescent material, and the light generating device is configured to combine the second light source light and the first luminescent material light (downstream of the first luminescent material). To this end, also (optional) optics may be applied, like a dichroic mirror.

As indicated above, the second light source light may in embodiments be one or more of reflected, transmitted, and scattered by the first luminescent material. For instance, in embodiments the first luminescent material may be transmissive for at least part of the second light source light. In embodiments, the first luminescent material may be comprised or be configured as a light transmissive body, such as in specific embodiments a light transparent body. In such embodiments, the second light source may be configured upstream of the first luminescent material. Therefore, in specific embodiments the first luminescent material may be transmissive for at least part of the second light source light, wherein the second light source is configured upstream of the first luminescent material, and wherein during the one or more operational modes at least part of the second light source light is transmitted through the first luminescent material to provide transmitted second light source light, wherein in the one or more operational modes of the light generating device the light generating device is configured to generate white device light comprising the first light source light, the optically filtered first luminescent material light, and the transmitted second light source light.

Especially, in embodiments the light generating device may comprise a luminescent body, wherein the luminescent body comprises the first luminescent material. In such embodiments, e.g. at one end the second light source may be configured and at the other end (at least part of) the second light source light may escape from the luminescent body. In such embodiments, it may also be possible to pump with a plurality of first light sources the luminescent body. This may further increase the output of the light generating device. Hence, in yet further specific embodiments the light generating device may comprise a plurality of first light sources, wherein the plurality of first light sources are configured to irradiate the luminescent body with the first light source light.

Instead of the term "luminescent body", and similar terms, also the term "light transmissive body", and similar terms, may be applied, as the luminescent body is also transmissive for the first luminescent material light.

As indicated above, the light generating system especially comprises a luminescent body. The luminescent body may comprise (N) side faces (over at least part of the length L), wherein N≤3. Hence, especially the luminescent body has a cross-sectional shape that is square (N=4), rectangular (N=4), hexagonal (n=6), or octagonal (n=8), especially rectangular. Would the luminescent body have a circular cross-section, N may be considered ∞.

The (elongated) body includes a first end or first face, in general configured perpendicular to one or more of the (n) side faces and a second end or second face, which may be configured perpendicular to one or more of the side faces, and thus parallel to the first face, but which also may be configured under an angle unequal to 90° and unequal to 180°. Hence, in embodiments in specific embodiments the radiation exit window has an angle unequal to 0° and unequal to 180° with one or more of the one or more side faces, especially all of the side faces. Note that the angle α may differ per for different side faces. For instance, a slanted radiation exit window of a bar shaped elongated body may have an angle of α1 with a first side face, an angle α2=180°−α1 with a second side face, and angles of 90° with the two other side faces.

The (elongated) luminescent body may thus in embodiments include (n) side faces, which comprise a first side face, comprising a radiation input face, and a second side face configured parallel to the first side face, wherein the side faces define a height (H). The first and the second side face are configured parallel with luminescent body material in between, thereby defining the width of the luminescent body. The radiation input face is at least part of the first face which may be configured to receive the light source light. The (elongated) luminescent body further comprises a radiation exit window bridging at least part of the height (H) between the first side face and the second side face. Especially, the radiation exit window is comprised by the second face. Further embodiments are also elucidated below. As indicated above, in embodiments the radiation exit window and the radiation input face have an angle (α) unequal to 0° and unequal to 180°. Yet further, as also indicated above in embodiments the radiation exit window has an angle unequal to 0° and unequal to 180° with one or more of the one or more side faces.

The light transmissive body has light guiding or wave guiding properties. Hence, the light transmissive body is herein also indicated as waveguide or light guide. As the light transmissive body is used as light concentrator, the light transmissive body is herein also indicated as light concentrator. The light transmissive body will in general have (some) transmission of one or more of (N)UV, visible and (N)IR radiation, such as in embodiments at least visible light, in a direction perpendicular to the length of the light transmissive body. Without the activator (dopant) such as trivalent cerium, the internal transmission in the visible might be close to 100%.

The transmission of the light transmissive body for one or more luminescence wavelengths may be at least 80%/cm, such as at least 90%/cm, even more especially at least 95%/cm, such as at least 98%/cm, such as at least 99%/cm. This implies that e.g. a 1 cm$^3$ cubic shaped piece of light transmissive body, under perpendicular irradiation of radiation having a selected luminescence wavelength (such as a wavelength corresponding to an emission maximum of the luminescence of the luminescent material of the light transmissive body), will have a transmission of at least 95%. Hence, the luminescent body is herein also indicated "light transmissive body", as this body is light transmissive for the luminescent material light.

Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses.

In embodiments, an anti-reflection coating may be applied to the luminescent body, such as to suppress Fresnel reflection losses (during the light incoupling process).

In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The term UV radiation may in specific embodiments refer to near UV radiation (NUV). Therefore, herein also the term "(N)UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR.

Herein, the term "visible light" especially relates to light having a wavelength selected from the range of 380-780 nm. The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The light transmissive body may have any shape, such as beam (or bar) like or rod like, however especially beam like (cuboid like). The light transmissive body, such as the luminescent concentrator, might be hollow, like a tube, or might be filled with another material, like a tube filled with water or a tube filled with another solid light transmissive medium. The invention is not limited to specific embodiments of shapes, neither is the invention limited to embodiments with a single exit window or outcoupling face. Below, some specific embodiments are described in more detail. Would the light transmissive body have a circular cross-section, then the width and height may be equal (and may be defined as diameter). Especially, however, the light transmissive body has a cuboid like shape, such as a bar like shape, and is further configured to provide a single exit window.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The radiation exit window may especially have an angle unequal to 0° and unequal to 180° with the radiation input face, such as angle(s) of 90°. Further, in specific embodiments the radiation exit window has an angle unequal to 0° and unequal to 180° with one or more of the one or more side faces, such as angle(s) of 90°.

Especially, in embodiments the solid state light source, or other light source, is not in (direct) physical contact with the light transmissive body.

Especially, in embodiments the light transmissive body comprises a radiation input face, configured in a light receiving relationship with the first light source, and a radiation exit face. Especially, in embodiments the radiation input face and the radiation exit face are not the same part of the light transmissive body, though it is not excluded that the same face may be used for providing the radiation input face and the radiation exit face. In specific embodiments, the radiation exit face and the radiation input face are comprises by different faces of the light transmissive body (see further also below).

Hence, the light transmissive body, more especially the radiation input face thereof, is configured downstream of the first light source. Or, in other words, the light transmissive body, more especially the radiation input face thereof, is radiationally coupled with the first light source.

The terms "radiationally coupled" or "optically coupled" may especially mean that (i) a light generating element, such as a light source, and (ii) another item or material, are associated with each other so that at least part of the radiation emitted by the light transmissive body is received by the item or material. In other words, the item or material is configured in a light-receiving relationship with the light transmissive body. At least part of the radiation of light transmissive body will be received by the item or material. This may in embodiments be directly, such as the item or material in physical contact with the (light emitting surface of the) light transmissive body. This may in embodiments be via a medium, like air, a gas, or a liquid or solid light guiding material. In embodiments, also one or more optics, like a lens, a reflector, an optical filter, may be configured in the optical path between light transmissive body and item or material.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

Hence, the light transmissive body is especially transmissive for at least part of the light source light propagating from the radiation input face to the radiation exit face. Further, the light transmissive body is especially further configured to convert part of the light source light propagating through the light transmissive body into first luminescent material light. Light transmissive body are known in the art, such as e.g. described in WO2006/054203, which is incorporated herein by reference.

As indicated above, the light transmissive body is especially configured to convert part of the light source light propagating through the light transmissive body into first luminescent material light having a first luminescent material light spectral power distribution differing from the first spectral power distribution of the first light source light. The first luminescent material light may especially be due to down conversion, see also above.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The generally rod shaped or bar shaped light transmissive body can have any cross-sectional shape, but in embodiments has a cross section the shape of a square, rectangle, round, oval, triangle, pentagon, or hexagon. Generally, the ceramic or crystal bodies are cuboid. In specific embodiments, the body may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a light transmissive body having a round cross section.

In embodiments, the body further has a lateral dimensions width or length (W or L) or diameter (D) and a thickness or height (H). In embodiments, (i) D≥H or (ii) and W≥H and/or L≥H. The luminescent tile may be transparent or light scattering. In embodiments, the tile may comprise a ceramic luminescent material.

In specific embodiments, L≤10 mm, such as especially L≤5 mm, more especially L≤3 mm, most especially L≤2 mm.

In specific embodiments, W≤10 mm, such as especially W≤5 mm, more especially W≤3 mm, most especially W≤2 mm.

In specific embodiments, H≤10 mm, such as especially H≤5 mm, more especially H≤3 mm, most especially H≤2 mm.

In specific embodiments, D≤10 mm, such as especially D≤5 mm, more especially D≤3 mm, most especially D≤2 mm.

In specific embodiments, the body may have in embodiments a thickness in the range 50 μm-1 mm. Further, the body may have lateral dimensions (width/diameter) in the range 100 μm-10 mm. In yet further specific embodiments, (i) D>H or (ii) W>H and W>H. Especially, the lateral dimensions like length, width, and diameter are at least 2 times, like at least 5 times, larger than the height.

In embodiments, a dichroic filter may be configured between the first light source and the first luminescent material, i.e. downstream of the first light source and upstream of the first luminescent material. Alternatively or additionally, a dichroic filter may be configured between the second light source and the first luminescent material, i.e. downstream of the second light source and upstream of the first luminescent material. A dichroic filter may be applied to allow the light source light be transmitted by the dichroic filter and the first luminescent material light to be reflected back. In this way, first luminescent material light propagating in the direction of the first light source and/or the second light source may at least partly be reused. Hence, in an embodiment a dichroic filter may be configured between the first luminescent material and the optical element.

The dichroic filter and first luminescent material may have a non-zero distance, such as e.g. selected from the range of 0.01-10 mm. Without physical contact, especially at a distance of at least about 0.001 mm, there may be less light loss.

When there is no dichroic filter (or other optics), in embodiments the (first and/or second light source may have a non-zero distance, such as e.g. selected from the range of 0.01-10 mm. Without physical contact, especially at a distance of at least about 0.001 mm, there may be less light loss. A non-zero distance may also allow different thermal pathways for the first light source and/or second light source and the first luminescent material.

One or more heat sinks may be configure din thermal contact with one or more of the first light source, the second light source, and the first luminescent material.

It may be desirable to (further) shape the device light into a beam of device light. Alternatively or additionally, it may be desirable to (further) homogenize the device light (into homogenized device light). To this end, an optical element may be used. Hence, in embodiments the light generating device may further comprise an optical element configured to beam shape the device light and/or configured to homogenize the device light. Especially, the optical element is configured downstream of the first luminescent material. Further, the optical element is configured downstream from one or more first light sources and downstream of the second light source.

The optical element may especially comprise a collimator used to convert (to "collimate") the light beam into a beam having a desired angular distribution. Further, the optical element especially comprises a light transmissive body comprising the radiation entrance window. Hence, the optical element may be a body of light transmissive material that is configured to collimate the converter radiation from the luminescent body. In specific embodiments, the optical element comprises a compound parabolic like collimator, such as a CPC (compound parabolic concentrator). A massive collimator, such as a massive CPC, may especially be used as extractor of light and to collimate the (emission) radiation. Alternatively, one may also comprise a dome with optical contact (n>1.00) on the nose of the rod or a hollow collimator, such as a CPC, to concentrate the (emission) radiation.

The optical element may have cross section (perpendicular to an optical axis) with a shape that is the same as the cross-section of the luminescent body (perpendicular to the longest body axis (which body axis is especially parallel to a radiation input face). For instance, would the latter have a rectangular cross section, the former may also have such rectangular cross section, though the dimension may be different. Further, the dimension of the optical element may vary over its length (as it may have a beam shaping function).

Further, the shape of the cross-section of the optical element may vary with position along the optical axis. In a specific configuration, the aspect ratio of a rectangular cross-section may change, preferably monotonically, with position along the optical axis. In another preferred configuration, the shape of the cross-section of the optical element may change from round to rectangular, or vice versa, with position along the optical axis.

As indicated above, the light generating device may further comprise control system configured to control the first light source (light) and the second light source (light). In specific embodiments, the control system is configured to control one or more optical properties of the device light, especially in further embodiments in dependence of a user interface, a sensor signal, and a timer. In specific embodiments, the one or more optical properties include the correlated color temperature and the color rendering index. In embodiments, in one or more controlling modes the control system is configured to keep the color rendering index above 85, especially over 87, at a correlated color temperature below 3100 K. In yet further embodiments, in one or more controlling modes the control system is configured to keep the correlated color temperature in the range of 2700-3000 K. In this range, the CRI can be kept high, such as even above 85, or even about 90. In yet further specific embodiments, the CRI is at least 88, while the correlated color temperature is equal to or less than 3000 K.

In specific embodiments, the (above-mentioned) optical filter may be a controllable optical filter. Hence, in specific embodiments the control system is further configured to control the controllable optical filter. Also, in this way the CRI and/or CCT may be controlled. Hence, in embodiments a tunable band pass filter may be applied.

The luminous efficiency of the device (light) may in embodiments be selected from the range of 290-370 lm/W, such as 300-360 lm/W (lm=lumen).

In embodiments, the light generating device is configured to provide the luminescent light with power emitted from the exit surface of the luminescent converter having a power density of 4 W/mm$^2$, especially a power density at least 7 W/mm$^2$, more especially at least 9 W/mm$^2$, even more especially at least 13 W/mm$^2$.

In yet further specific embodiments, the lighting device may be configured to provide luminescent light in combination with blue and/or red laser light coming out the same surface as the luminescent light providing white light with a brightness of at least 2000 lm/mm$^2$, more especially at least 3000 lm/mm$^2$, even more especially at least 6000 lm/mm$^2$ Herein, "lm" refers to lumen.

In yet a further aspect, the invention also provides a luminaire comprising the light generating device as defined herein.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

The terms "visible", "visible light" or "visible emission" and similar terms refer to light having one or more wavelengths in the range of about 380-780 nm.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
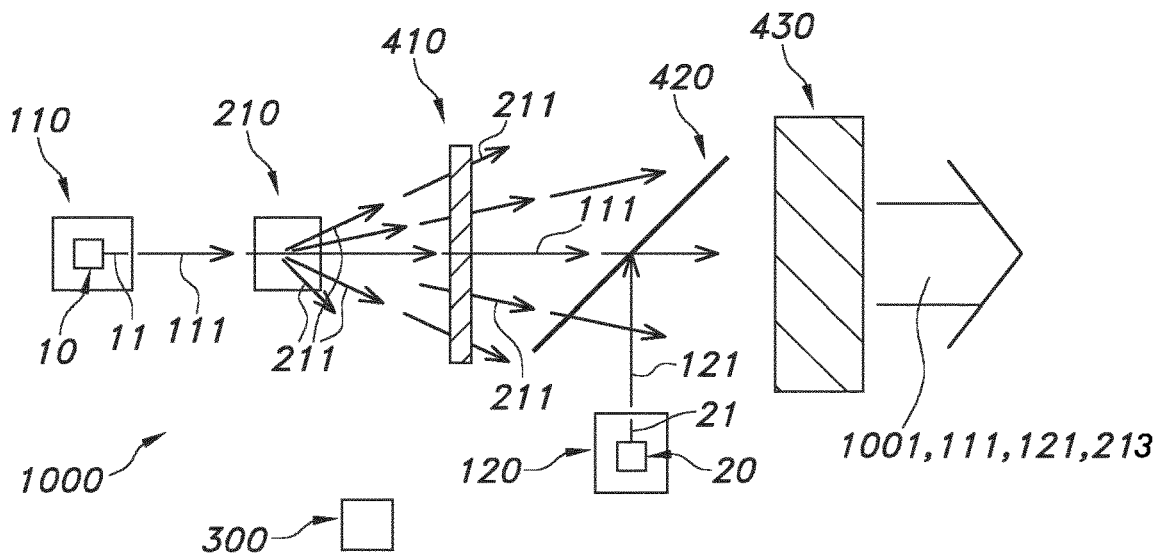
FIGS. 1a-1b schematically depict some possible embodiments.
Figure 1B:
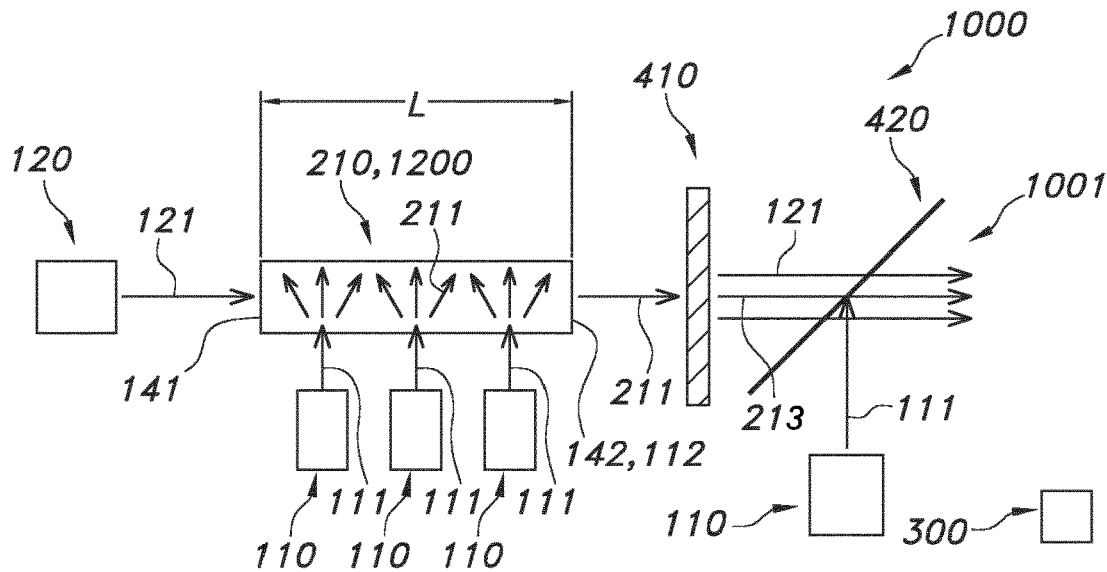

FIGS. 1a-1b schematically depict some possible embodiments of a light generating device 1000 configured to generate device light 1001. The light generating device 1000 comprises (i) a first light source 110 configured to generate blue first light source light 111. Especially, the first light source 110 comprises a first laser light source 10. The first laser light source 10 is especially configured to generate first laser light source light 11. Especially, the first laser light source light 11 is blue light. The light generating device 1000 further comprises (ii) a first luminescent material 210 configured to convert part of the blue first light source light 111 into first luminescent material light 211. The luminescent material light 211 may have an emission band having wavelengths in one or more of the green and yellow. The light generating device 1000 may further comprise (iii) an optical filter 410 configured to optically filter the first luminescent material light 211 into optically filtered first luminescent material light 213, whereby the optically filtered first luminescent material light 213 is red-shifted relative to the first luminescent material light 211. The light generating device 1000 further comprise (iv) a second light source 120 configured to generate red second light source light 121. Especially, the second light source 120 comprises a second laser light source 20 (configured to generate second laser light source light 21.

As schematically depicted, in one or more operational modes of the light generating device 1000 the light generating device 1000 is configured to generate white device light 1001 comprising the first light source light 111, the optically filtered first luminescent material light 213, and the second light source light 121.

Especially, the first luminescent material 210 may comprise a luminescent material of the type $A_3B_5O_{12}$:Ce, wherein A comprises one or more of Y, La, Gd, Tb and Lu, especially (at least) one or more of Y, Gd, Tb and Lu, and wherein B comprises one or more of Al, Ga, In and Sc, wherein A comprises at least one or more of Y, Gd, and Lu, and wherein B comprises at least Al. As indicated above, the luminescent material 210 may comprise $Y_{x1-x2-x3}A_{x2}Ce_{x3}Al_{y1-y2}B_{y2}5O_{12}$, wherein $x1+x2+x3=1$, wherein $x3>0$, wherein $0<x2+x3\leq0.2$, wherein $y1+y2=1$, wherein $0\leq y2\leq0.2$, wherein A comprises one or more elements selected from the group consisting of lanthanides, and wherein B comprises one or more elements selected from the group consisting of Ga, In and Sc. At maximum 10% of B—O may be replaced by Si—N; B—O may thus comprise B'—O. Especially, x3 is selected from the range of 0.001-0.1, wherein 0<x2+x3≤0.1, and wherein 0≤y2≤0.1. As indicated above, in embodiments x1>0.

In specific embodiments, see also above, the light generating device 1000 comprises luminescent material, wherein at least 95 weight % of the luminescent material comprises $(Y_{x1-x2-x3}A'_{x2}Ce_{x33})_3(Al_{y1-y2}B'_{y2})_5O_{12}$. Hence, essentially all luminescent material light comprised by the device light 1001 may be based on this $(Y_{x1-x2-x3}A'_{x2}Ce_{x33})_3(Al_{y1-y2}B'_{y2})_5 O_{12}$ luminescent material.

In embodiments, as schematically depicted in FIG. 1a, the second light source 120 may be configured downstream of the first luminescent material 210. In such embodiments, the light generating device 1000 may be configured to combine the second light source light 121 and the first luminescent material light 211 (downstream of the first luminescent material 210). For instance, optical element 420 may be applied to introduce the second light source light 121. Optical element 420 may e.g. be a dichroic mirror. For cooling of the first luminescent material, a heat sink (not shown) may be applied.

The light generating device 1000 may further comprise a control system 300 configured to control the first light source 110 and the second light source 120. In embodiments, the control system is configured to control one or more optical properties of the device light 1001, for instance in dependence of a user interface, a sensor signal, and a timer (not shown). For example, the one or more optical properties include the correlated color temperature and the color rendering index. Hence, in embodiments in one or more controlling modes the control system 300 is configured to keep the color rendering index over 85 and the correlated color temperature below 3100 K, such as equal to or below 3000, but in other embodiments especially (also) equal to or above 2700 K.

In embodiments, the optical filter 410 may be a controllable optical filter 410. Hence, in such embodiments the control system 300 may further configured to control the controllable optical filter 410.

A controllable optical filter may include in embodiments a rotatable wheel with a plurality of different filters, wherein one of them may be configured in the optical path. By changing filters, different optical properties may be obtained.

FIG. 1a also schematically depicts an embodiment wherein the light generating device 1000 further comprises an optical element 430 configured to beam shape the device light 1001 and/or configured to homogenize the device light 1001. As schematically depicted the optical element 430 is configured downstream of the first luminescent material 210. For instance, the optical element 430 may comprise a CPC like optical element.

FIG. 1b schematically depicts an embodiment wherein the first light source 110 and optional first optics 420 are configured to irradiate the first luminescent material 210 with a part of the first light source light 111, wherein another part of the first light source light 111 is configured to bypass the first luminescent material 210. Here, a plurality of first light sources 110 are applied, of which one or more are configured to pump the first luminescent material and of which one or more are configured to bypass the first luminescent material 210. For instance, in one or more operational modes of the light generating device 1000 the light generating device 1000 may be configured to generate white device light 1001 comprising the first light source light 111 that bypassed the first luminescent material 210, the optically filtered first luminescent material light 213, and the second light source light 121.

FIG. 1b also schematically depicts an embodiment wherein the first luminescent material 210 is transmissive for at least part of the second light source light 121. Here, the second light source 120 is configured upstream of the first luminescent material 210. Hence, during the one or more operational modes at least part of the second light source light 121 is transmitted through the first luminescent material 210 to provide transmitted second light source light 121. In the one or more operational modes of the light generating device 1000 the light generating device 1000 may be configured to generate white device light 1001 comprising the first light source light 111, the optically filtered first luminescent material light 213, and the transmitted second light source light 121.

FIG. 1b also schematically depicts an embodiment of the light generating device 1000, comprising a luminescent body 1200. The luminescent body 1200 comprises the first luminescent material 200. Further, especially in embodiments the light generating device 1000 comprises a plurality of first light sources 110, wherein the plurality of first light sources 110 are configured to irradiate the luminescent body 1200 with the first light source light 111.

The luminescent body 1200 has a length L. Further, the body 1200 may have a width W and height H (not depicted) or a diameter D (not depicted). The luminescent body may have a first end face 141 and a second end face 142, defining the length L. Further, the luminescent body has a radiation input face 111, which may be a side face, or part of a side face, and a radiation exit window 112, which may especially be comprised by an end face, such as second end face 142. Further, reflectors may be available (not depicted herein). For further embodiments, it is referred to WO2018141625, which is herein incorporated by reference, or to WO2006/054203, which is incorporated herein by reference.

Figure 2A:
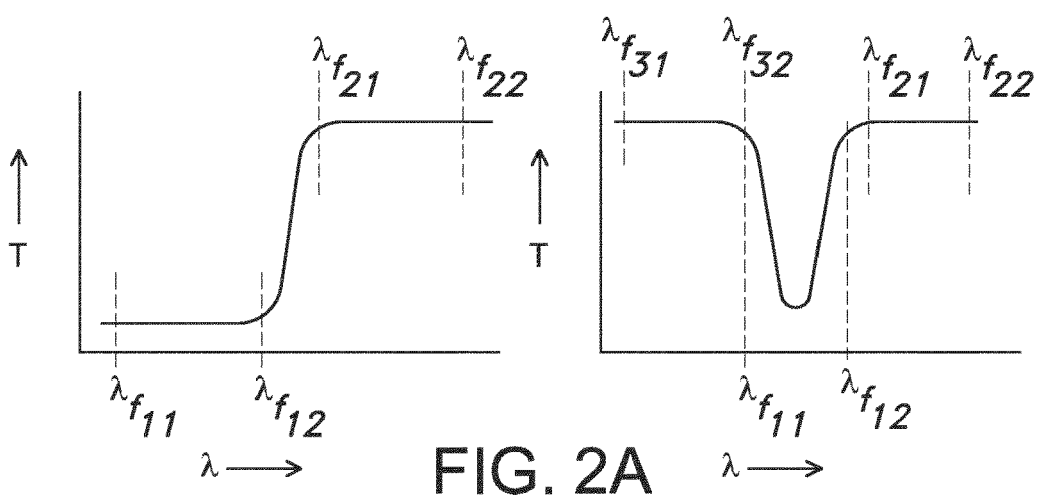
FIGS. 2a-2b schematically depict some aspects.

FIG. 2a schematically depicts possible embodiments of the optical filter 410. The optical filter 410 has a wavelength dependent light transmission with a first wavelength range $\lambda_{f11}$-$\lambda_{f12}$ having a first wavelength averaged light transmission and a second wavelength range $\lambda_{f21}$-$\lambda_{f22}$ having a second wavelength averaged light transmission. As schematically depicted the first wavelength averaged light transmission is smaller than the second wavelength averaged light transmission. Further, as schematically depicted $\lambda_{f11}<\lambda_{f12}\leq\lambda_{f21}<\lambda_{f22}$. Especially, $\lambda_{f12}$ and $\lambda_{f21}$ are selected from the range of 515 nm±20 nm. As shown above, the optical filter 410 is configured downstream of the first luminescent material 210 (see FIGS. 1a-1b).

The left drawing schematically depicts a long pass filter and the right drawing schematically depicts a rejection filter or inverse bandpass filter, such as a dichroic filter. As schematically depicted, in both embodiments the first wavelength averaged light transmission may be at least two times smaller than the second wavelength averaged light transmission. Referring to the left drawing, which schematically may represent a rejection filter, there may thus be a further wavelength range, at wavelengths shorter than the first wavelength range, where the transmission is in average higher than in the first wavelength range. Here, by way of example the transmission at both sides of the first wavelength range are essentially the same (though this is not necessarily the case). When referring to the embodiments of FIGS. 1a and 1b, the left optical filter may especially be useful for the embodiment of FIG. 1b, and the right optical filter may especially be used for the embodiment of FIG. 1a.

Figure 2B:
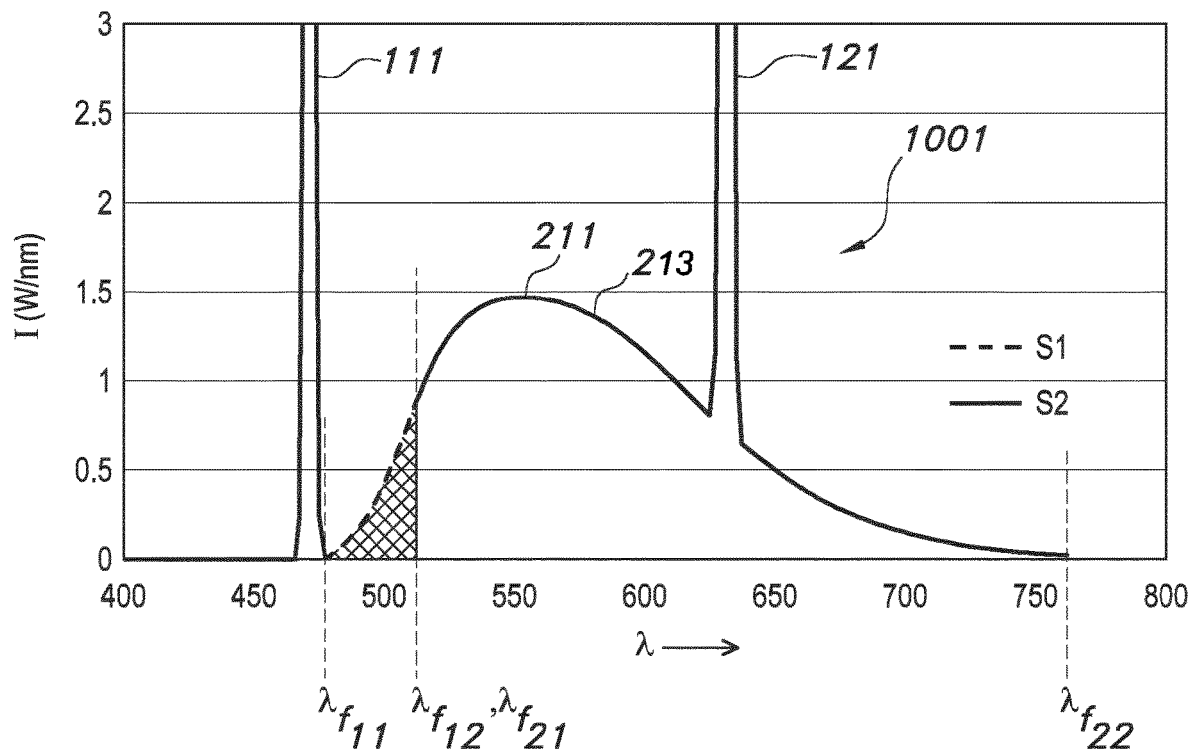

FIG. 2b schematically depicts an embodiments of device light 1001, wherein S1 shows device light with unfiltered luminescent material light 211, and S2 is device light 1001 with filtered luminescent material light 213. The triangle shaped part of the spectral power distribution is filtered away (and is essentially the only difference between S1 and S2). As schematically depicted, $\lambda_{f11} > \lambda_1$. As indicated above, indicates the peak emission of the first light source light 111. Further, especially $\lambda_{f21} < 530$ nm.

Further, as depicted in FIG. 2b the first light source light 111 has a peak maximum $\lambda_1$, wherein $\lambda_1$ is selected from the range of 470 nm±5 nm, and the second light source light 121 has a peak maximum $\lambda_2$, wherein $\lambda_2$ is selected from the range of 630 nm±5 nm.

Hence, amongst others herein the use of a blue laser to pump Ce doped YAG with laser with emission of 440-470 nm is proposed. The emission from Ce doped YAG is then combined with blue laser emission at 470 nm and also with red laser emission at 630 nm to produce CCT in the range of <3000K. However, the with these combinations CRI was found the be below 90. In order to obtained CRI>90 at CCT 3000K we removed a small part of the YAG emission as shown in FIG. 2b. The removed power from the total corresponds to only 3% of the power in the spectrum. The characteristics of the light source before and after removing part of the Ce doped YAG spectrum is shown in table 1. In order to obtain CRI larger than 90 at CCT 2700 we did the same and removed part of the Ce doped YAG emission. However, this time it was necessary to remove lager part of the spectrum corresponding to 4.5% of the total power. By doing this emission with CRI 90 at CCT=2700K was obtained. The characteristics of the light source before and after removing part of the Ce doped YAG spectrum is shown in table 2:

TABLE 1

|  | YAG-Ce | Filtered |
|---|---|---|
| CCT (K) | 3000 | 3000 |
| CRI | 84 | 90 |
| R9 | 26 | 52 |
| Lm/Wopt | 321 | 329 |
| Red (630 nm) (power a.u.) | 88 | 77 |
| Phosphor (power a.u.) | 187 | 177 |
| Blue (470 nm) (power a.u.) | 43 | 43 |
|  | | 3% total power of white light source light is filtered, 5% of phosphor emission is filtered |

TABLE 2

|  | YAG-Ce | Filtered |
|---|---|---|
| CCT (K) | 2700 | 2700 |
| CRI | 80 | 90 |
| R9 | 16 | 50 |
| Lm/Wopt | 318 | 328 |
| Red (630 nm) (power a.u.) | 108 | 89 |
| Phosphor (power a.u.) | 187 | 172 |
| Blue (470 nm) (power a.u.) | 35 | 35 |
|  | | 4.5% total power of white light source light is filtered, 8% of phosphor emission is filtered |

Basically, the same was done with a slightly changed red laser wavelength and addition of a red phosphor (Eu2+ based nitride) (next to the YAG phosphor):

TABLE 3

|  | YAG-Ce | Filtered |
|---|---|---|
| CCT (K) | 2840 | 2840 |
| CRI | 85 | 90 |
| R9 | 23 | 49 |
| Lm/Wopt | 298 | 305 |
| Red (630 nm) (power a.u.) | 85 | 71 |
| YAG Phosphor (power a.u.) | 187 | 172 |
| Red nitride phosphor (power a.u.) | 40 | 40 |
| Blue (470 nm) (power a.u.) | 35 | 35 |
|  | | 3% total power of white light source light is filtered, 5% of phosphor (YAG + red phosphor) emission is filtered |

Again, here it can be seen that CRI can be increased with only a small light loss.

Figure 3:
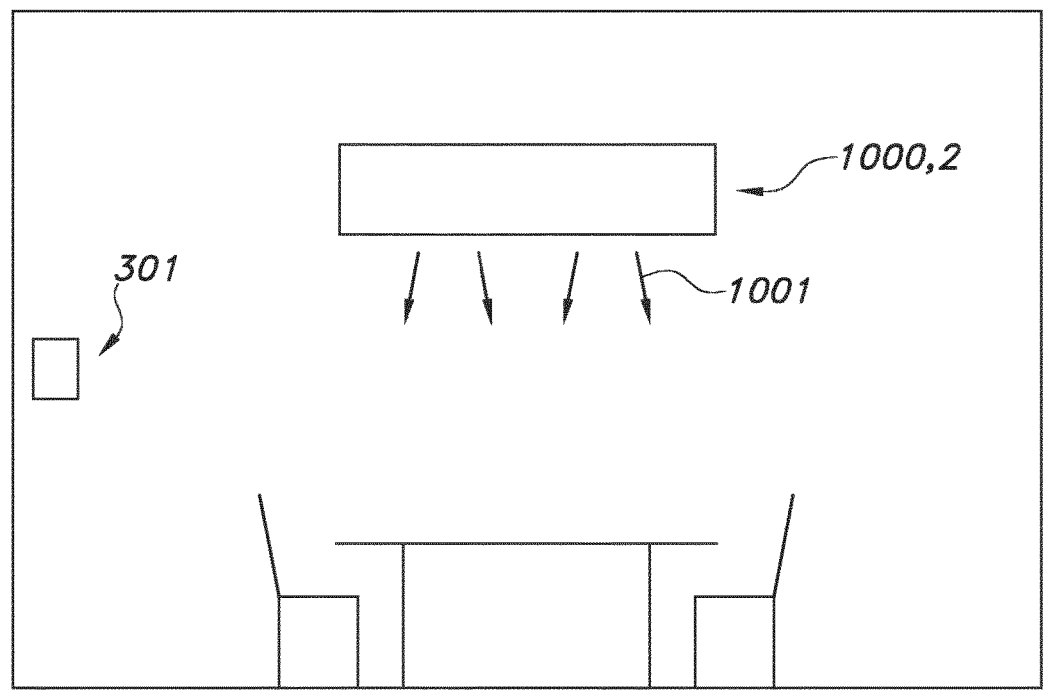
FIG. 3 schematically depict a further embodiment.

FIG. 3 schematically depicts an embodiment of a luminaire 2 comprising the light generating device 1000 as described above. Reference 301 indicates a user interface which may be functionally coupled with the control system (not depicted) comprised by or functionally coupled to the lighting system 1000.

Figure 4:
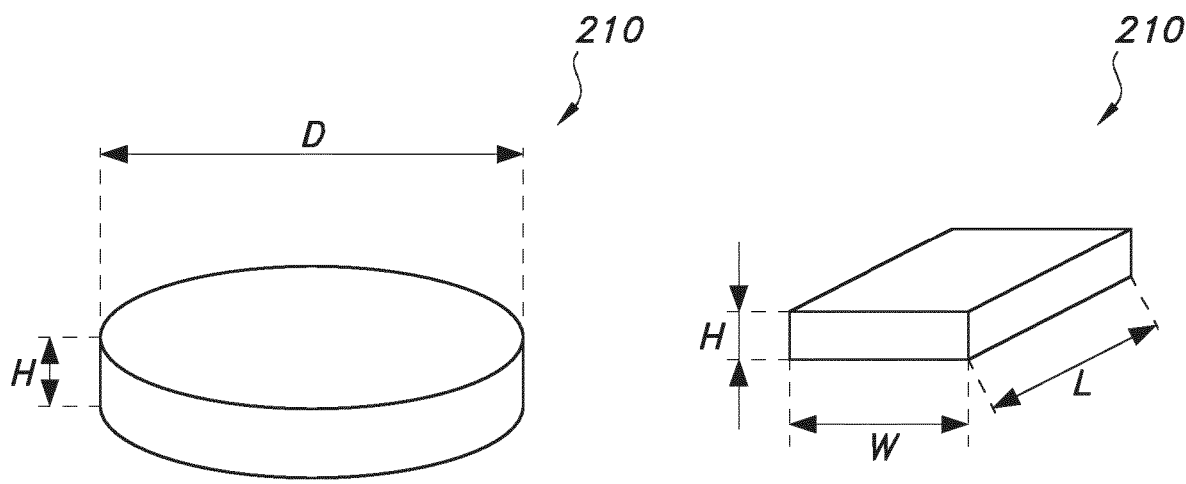
FIG. 4 schematically depict some embodiments of the luminescent material (body).

FIG. 4 schematically depict some possible embodiments of the (first) luminescent material 210. The first luminescent material 210 may be provided as layer or body. The luminescent material may also be provided a layer or body comprising the (first) luminescent material. The layer or body may have dimensions selected from diameter (D) or length L and width W, and height H. First light source light may be provided to one of the sides with the relatively large area, i.e. to the circular side with diameter D in the left embodiment, or the top face or bottom face having an area W*L in the right embodiment.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device configured to generate device light, wherein the light generating device comprises (i) a first light source configured to generate blue first light source light, wherein the first light source is a first laser light source, (ii) a first luminescent material configured to convert part of the blue first light source light into first luminescent material light having an emission band having wavelengths in one or more of the green and yellow, (iii) an optical filter configured to optically filter the first luminescent material light into optically filtered first luminescent material light, whereby the optically filtered first luminescent material light is red-shifted relative to the first luminescent material light, and (iv) a second light source configured to generate red second light source light, wherein the second light source comprises a second laser light source; wherein in one or more operational modes of the light generating device the light generating device is configured to generate white device light comprising the first light source light, the optically filtered first luminescent material light, and the second light source light,
wherein the light generating device further comprises a control system configured to control the first light source and the second light source, wherein the control system is configured to control one or more optical properties of the device light,
wherein the one or more optical properties include the correlated color temperature and the color rendering index, wherein in one or more controlling modes the control system is configured to keep the color rendering index over 85 and the correlated color temperature below 3100 K.

2. The light generating device according to claim 1, wherein the first light source light has a peak maximum $\lambda_1$, wherein $\lambda_1$ is selected from the range of 470 nm±10 nm, and wherein the second light source light has a peak maximum $\lambda_2$, wherein $\lambda_2$ is selected from the range of 630 nm±10 nm.

3. The light generating device according to claim 2, wherein the optical filter has a wavelength dependent light transmission with a first wavelength range of $\lambda_{f11}$-$\lambda_{f12}$ nm having a first wavelength averaged light transmission and a second wavelength range of $\lambda_{f21}$-$\lambda_{f22}$ nm having a second wavelength averaged light transmission, wherein the first wavelength averaged light transmission is smaller than the second wavelength averaged light transmission, wherein $\lambda_{f11} < \lambda_{f123} \leq \lambda_{f21} < \lambda_{f22}$, and wherein $\lambda_{f12}$ and $\lambda_{f21}$ are selected from the range of 515 nm±20 nm.

4. The light generating device according to claim 3, wherein $\lambda_{f11} > \lambda_1$, wherein $\lambda_{f21} < 530$ nm, and wherein the first wavelength averaged light transmission is at least two times smaller than the second wavelength averaged light transmission.

5. The light generating device according to claim 1, wherein the luminescent material comprises $A_3B_5O_{12}$:Ce, wherein A comprises one or more of Y, La, Gd, Tb and Lu, and wherein B comprises one or more of Al, Ga, In and Sc, wherein at maximum 10% of B—O may be replaced by Si—N.

6. The light generating device according to claim 5, wherein at least 95 weight % of the luminescent material comprises $(Y_{x1-x2-x3}A'_{x2}Ce_{x3})_3(Al_{y1-y2}B'_{y2})_5O_{12}$, wherein x1+x2+x3=1, wherein x1>0, wherein x3>0, wherein 0<x2+x3≤0.2, wherein y1+y2=1, wherein 0≤y2≤0.2, wherein A' comprises one or more elements selected from the group consisting of lanthanides, and wherein B' comprises one or more elements selected from the group consisting of Ga, In and Sc and wherein a dominant wavelength of the optically filtered first luminescent material light is red-shifted relative to the first luminescent material light with a shift selected from the range of 1-10 nm.

7. The light generating device according to claim 1, wherein the first light source and an optional first optics are configured to irradiate the first luminescent material with a part of the first light source light, wherein another part of the first light source light is configured to bypass the first luminescent material; wherein in one or more operational modes of the light generating device the light generating device is configured to generate white device light comprising the first light source light that bypassed the first luminescent material, the optically filtered first luminescent material light, and the second light source light.

8. The light generating device according to claim 1, wherein the second light source is configured downstream of the first luminescent material, and wherein the light generating device is configured to combine the second light source light and the first luminescent material light.

9. The light generating device according to claim 1, wherein the first luminescent material is transmissive for at least part of the second light source light, wherein the second light source is configured upstream of the first luminescent material, and wherein during the one or more operational modes at least part of the second light source light is transmitted through the first luminescent material to provide transmitted second light source light, wherein in the one or more operational modes of the light generating device the light generating device is configured to generate white device light comprising the first light source light, the optically filtered first luminescent material light, and the transmitted second light source light.

10. The light generating device according to claim 1, comprising a luminescent body, wherein the luminescent body comprises the first luminescent material, wherein the light generating device comprises a plurality of first light sources, wherein the plurality of first light sources are configured to irradiate the luminescent body with the first light source light.

11. The light generating device according to claim 1, further comprising an optical element configured to beam shape the device light and/or configured to homogenize the device light, wherein the optical element is configured downstream of the first luminescent material.

12. The light generating device according to claim 1, wherein the control system is configured to control the one or more optical properties of the device light in dependence of a user interface, a sensor signal, and a timer.

13. The light generating device according to claim 12, wherein the first laser light source is configured to generate first laser light source light and wherein the blue first light source light is first laser light source light, wherein the second laser light source is configured to generate second laser light source light and wherein the red second light source light is second laser light source light, wherein the optical filter is a controllable optical filter, wherein the control system is further configured to control the controllable optical filter.

14. The light generating device according to claim 1, wherein the first light source and a first optics are configured to irradiate the first luminescent material with a part of the first light source light, wherein another part of the first light source light is configured to bypass the first luminescent material; wherein in one or more operational modes of the light generating device the light generating device is configured to generate white device light comprising the first light source light that bypassed the first luminescent material, the optically filtered first luminescent material light, and the second light source light.

15. A luminaire comprising the light generating device according to claim 1.

16. The light generating device according to claim 1, wherein the white device light has a power loss of less than 10% with respect to total power of the white light.

* * * * *